(12) United States Patent
Bae et al.

(10) Patent No.: US 12,113,077 B2
(45) Date of Patent: Oct. 8, 2024

(54) POLISHING SLURRY, METHOD FOR MANUFACTURING A DISPLAY DEVICE USING THE SAME AND DISPLAY DEVICE

(71) Applicants: Samsung Display Co., LTD., Yongin-si (KR); UBmaterials Inc., Yongin-si (KR)

(72) Inventors: Joon-Hwa Bae, Suwon-si (KR); Jin Hyung Park, Yongin-si (KR); Bonggu Kang, Seoul (KR); Seungbae Kang, Suwon-si (KR); Heesung Yang, Seoul (KR); Woojin Cho, Yongin-si (KR); Byoung Kwon Choo, Hwaseong-si (KR)

(73) Assignees: SAMSUNG DISPLAY CO., LTD.; UBMATERIALS LNC., Yongin-si (KR)

( * ) Notice: Subject to any disclaimer, the term of this patent is extended or adjusted under 35 U.S.C. 154(b) by 168 days.

(21) Appl. No.: 16/927,327

(22) Filed: Jul. 13, 2020

(65) Prior Publication Data
US 2021/0043661 A1    Feb. 11, 2021

(30) Foreign Application Priority Data
Aug. 6, 2019    (KR) .......................... 10-2019-0095524

(51) Int. Cl.
*H01L 27/12* (2006.01)
*C09G 1/02* (2006.01)
(Continued)

(52) U.S. Cl.
CPC ............ *H01L 27/1251* (2013.01); *C09G 1/02* (2013.01); *C09K 3/1409* (2013.01);
(Continued)

(58) Field of Classification Search
CPC ... C09G 1/02; C09K 3/1409; H01L 21/31053; H01L 27/1225; H01L 27/1229;
(Continued)

(56) References Cited

U.S. PATENT DOCUMENTS 7,449,124 B2 *   11/2008   Webb ....................... B24B 1/00
                                                            438/692
10,119,048 B1    11/2018   Guo et al.
(Continued)

FOREIGN PATENT DOCUMENTS

KR    10-2004-0098938    11/2004
KR    10-2005-0060213     6/2005
(Continued)

*Primary Examiner* — Edward Chin
(74) *Attorney, Agent, or Firm* — KILE PARK REED & HOUTTEMAN PLLC

(57) ABSTRACT

A polishing slurry is disclosed which includes about 0.01 wt % to about 10 wt % of polishing particles, about 0.005 wt % to about 0.1 wt % of a dispersing agent, about 0.001 wt % to about 1 wt % of an oxide-polishing promoter including a pyridine compound, about 0.05 wt % to about 0.1 wt % of a nitride-polishing inhibitor including an amino acid or an anionic organic acid, and water. A method for manufacturing a display device including an active pattern disposed on a base substrate, a gate metal pattern including a gate electrode overlapping the active pattern, a planarized insulation layer disposed on the gate metal pattern, and a source metal pattern disposed on the planarized insulation layer is also disclosed.

8 Claims, 6 Drawing Sheets

(51) Int. Cl.
*C09K 3/14* (2006.01)
*H01L 21/3105* (2006.01)

(52) U.S. Cl.
CPC .... *H01L 21/31053* (2013.01); *H01L 27/1229* (2013.01); *H01L 27/1248* (2013.01); *H01L 27/1259* (2013.01)

(58) Field of Classification Search
CPC ............... H01L 27/124; H01L 27/1248; H01L 27/1251; H01L 27/1259
See application file for complete search history.

(56) References Cited

U.S. PATENT DOCUMENTS

| | | | | |
|---|---|---|---|---|
| 10,787,592 | B1* | 9/2020 | Penta | C09G 1/02 |
| 2004/0067649 | A1* | 4/2004 | Hellring | B82Y 30/00 |
| | | | | 438/692 |
| 2004/0077295 | A1* | 4/2004 | Hellring | C09G 1/02 |
| | | | | 451/41 |
| 2006/0191872 | A1* | 8/2006 | Webb | H01L 21/31053 |
| | | | | 257/E21.244 |
| 2006/0246723 | A1* | 11/2006 | Park | H01L 21/31053 |
| | | | | 438/692 |
| 2007/0293049 | A1* | 12/2007 | Minamihaba | C09G 1/02 |
| | | | | 438/692 |
| 2008/0085602 | A1* | 4/2008 | Seong | H01L 21/31053 |
| | | | | 257/E21.244 |
| 2008/0116172 | A1* | 5/2008 | Babu | H01L 21/31053 |
| | | | | 216/89 |
| 2009/0130849 | A1* | 5/2009 | Lee | H01L 21/02063 |
| | | | | 438/693 |
| 2010/0068883 | A1* | 3/2010 | Shin | C09G 1/02 |
| | | | | 438/693 |
| 2013/0200039 | A1* | 8/2013 | Noller | H01L 21/31053 |
| | | | | 216/13 |
| 2016/0358790 | A1* | 12/2016 | Shi | H01L 21/31053 |
| 2017/0066944 | A1* | 3/2017 | Cui | C09K 3/1463 |
| 2017/0088748 | A1* | 3/2017 | Stender | C09K 3/1463 |
| 2019/0092973 | A1* | 3/2019 | Penta | H01L 21/76224 |
| 2019/0284434 | A1* | 9/2019 | Brosnan | H01L 21/31053 |
| 2019/0316003 | A1* | 10/2019 | Kim | C09K 3/1409 |
| 2020/0048551 | A1* | 2/2020 | Tsai | H01L 21/31053 |
| 2020/0172763 | A1* | 6/2020 | Park | C09G 1/02 |
| 2020/0199409 | A1* | 6/2020 | Turner | C09G 1/02 |
| 2020/0203172 | A1* | 6/2020 | Ballesteros | H01L 21/31053 |
| 2021/0179891 | A1* | 6/2021 | Park | H01L 21/3212 |

FOREIGN PATENT DOCUMENTS

| | | |
|---|---|---|
| KR | 10-1406758 | 7/2014 |
| KR | 10-1470979 | 12/2014 |
| KR | 10-2015-0010570 | 1/2015 |
| KR | 10-2015-0024876 | 3/2015 |
| KR | 10-1557542 | 10/2015 |

* cited by examiner

POLISHING SLURRY, METHOD FOR MANUFACTURING A DISPLAY DEVICE USING THE SAME AND DISPLAY DEVICE

CROSS-REFERENCE TO RELATED APPLICATION(S)

This application claims priority to and benefits of Korean Patent Application No. 10-2019-0095524 under 35 U.S.C. § 119(a), filed on Aug. 6, 2019 in the Korean Intellectual Property Office, the disclosure of which is incorporated herein by reference in its entirety.

BACKGROUND

1. Technical Field

The disclosure relates to a polishing slurry. More specifically, embodiments relate to a polishing slurry, a method for manufacturing a display device using the polishing slurry, and a display device.

2. Description of the Related Art

A display device such as an organic light-emitting display device or a liquid crystal display device may include an array of thin film transistors to drive pixels. An inorganic material such as silicon oxide is used for forming insulation layers disposed in a thin film transistor or covering the thin film transistor.

An insulation layer including an inorganic material may have an uneven surface depending on a shape of a structure disposed thereunder. When a capacitor electrode is formed on the insulation layer having an uneven surface, the capacitance may be reduced. Furthermore, a disconnection or undesired increase of skew may be generated.

SUMMARY

Embodiments provide a polishing slurry that may be used for planarizing a surface of a display device.

Embodiments provide a method for manufacturing a display device using the polishing slurry.

Embodiments provide a display device including a planarized insulation layer.

According to an embodiment, a polishing slurry includes about 0.01 wt % to about 10 wt % of polishing particles, about 0.005 wt % to about 0.1 wt % of a dispersing agent, about 0.001 wt % to about 1 wt % of an oxide-polishing promoter including a pyridine compound, about 0.05 wt % to about 0.1 wt % of a nitride-polishing inhibitor including an amino acid or an anionic organic acid, and water.

In an embodiment, the polishing particles may include at least one selected from the group consisting of ceria, silica, alumina, zirconia, and titania particles.

In an embodiment, an average diameter of the polishing particles may be about 6 nm to about 350 nm, preferably about 20 nm to about 100 nm.

In an embodiment, the dispersing agent may include at least one selected from the group consisting of an anionic dispersing agent, a cationic dispersing agent, a non-ionic dispersing agent, and a hydroxyl acid compound.

In an embodiment, the oxide-polishing promoter may include at least one selected from the group consisting of picolinic acid, nicotinic acid, and isonicotinic acid.

In an embodiment, the nitride-polishing inhibitor may include at least one selected from the group consisting of glycine, alanine, proline, valine, leucine, isoleucine, methionine, phenylalanine, tyrosine, tryptophan, serine, threonine, cysteine, asparagine, glutamine, lysine, arginine, histidine, aspartic acid, glutamic acid, acetic acid, gluconic acid, succinic acid, oxalic acid, malic acid, and maleic acid.

In an embodiment, a polishing selectivity of the polishing slurry for silicon oxide to silicon nitride may be at least about 70:1.

In an embodiment, a pH of the polishing slurry may be about 3 to about 8.

In an embodiment, the polishing particles may include ceria particles, the dispersing agent may include a non-ionic dispersing agent, the oxide-polishing promoter may include a pyridine carboxylic acid, and the nitride-polishing inhibitor may include an anionic amino acid.

According to an embodiment, a method for manufacturing a display device is provided. According to the method, a lower structure of a display device is formed, and a preliminary insulation layer is formed on a lower structure. The preliminary insulation layer may include a silicon nitride layer and a silicon oxide layer on the silicon nitride layer. The preliminary insulation layer may be polished by a polishing slurry to form a planarized insulation layer. The polishing slurry may include about 0.01 wt % to about 10 wt % of polishing particles; about 0.005 wt % to about 0.1 wt % of a dispersing agent; about 0.001 wt % to about 1 wt % of an oxide-polishing promoter including a pyridine compound; about 0.05 wt % to about 0.1 wt % of a nitride-polishing inhibitor including an amino acid or an anionic organic acid; and water. The upper surface of the planarized insulation layer may include an oxide-exposed area including silicon oxide and a nitride-exposed area including silicon nitride and overlapping a portion of the lower structure.

In an embodiment, a source metal pattern including a source electrode and a drain electrode may be formed on the planarized insulation layer. The forming of the lower structure may include forming an active pattern and forming a gate electrode disposed on the active pattern.

In an embodiment, a second source metal pattern including a connection electrode may be formed on the planarized insulation layer. The forming of the lower structure may include forming a first source metal pattern including a source electrode and a drain electrode electrically contacting the connection electrode.

In an embodiment, the forming of the preliminary insulation layer further may include forming a lower silicon oxide layer under the silicon nitride layer.

In an embodiment, the forming of the lower structure of the display device may include forming a first active pattern including polysilicon, forming a first gate electrode disposed on the first active pattern, forming a second active pattern including an oxide semiconductor, and forming a second gate electrode disposed on the second active pattern.

According to an embodiment, a display device may include an active pattern disposed on a base substrate, a gate metal pattern including a gate electrode overlapping the active pattern, a planarized insulation layer disposed on the gate metal pattern, and a source metal pattern disposed on the planarized insulation layer. The planarized insulation layer may include a silicon nitride layer and a silicon oxide layer disposed on the silicon nitride layer. An upper surface of the planarized insulation layer may include an oxide-exposed area including silicon oxide and a nitride-exposed area including silicon nitride and overlapping at least a portion of the gate metal pattern.

In an embodiment, the planarized insulation layer may further include a lower silicon oxide layer disposed under the silicon nitride layer.

In an embodiment, the gate metal pattern may include a first gate metal pattern including the gate electrode and a second gate metal pattern disposed on the first gate metal pattern and including a gate wiring pattern.

In an embodiment, the source metal pattern may include a source electrode electrically contacting the active pattern and a drain electrode electrically contacting the active pattern and spaced apart from the source electrode.

In an embodiment, the active pattern may include a first active pattern including polysilicon and a second active pattern including an oxide semiconductor. The gate metal pattern may include a first gate electrode overlapping the first active pattern and a second gate electrode overlapping the second active pattern.

According to the embodiments, a polishing slurry may have a large selectivity between silicon oxide and silicon nitride. Thus, in the process of planarizing a silicon oxide layer using a silicon nitride layer as an etch-stop layer, a planarized insulation layer may have a substantially flat surface and a small residual distribution ratio.

Thus, profile uniformity of a pattern formed on the planarized insulation layer may be increased, and defects such as disconnection may be reduced. Furthermore, an efficient design for reducing a line width or the like may be achieved.

BRIEF DESCRIPTION OF THE DRAWINGS

Aspects of one or more embodiments of the inventive concept will be more clearly understood from the following detailed description taken in conjunction with the accompanying drawings.

DETAILED DESCRIPTION OF THE EMBODIMENTS

Figure 1:
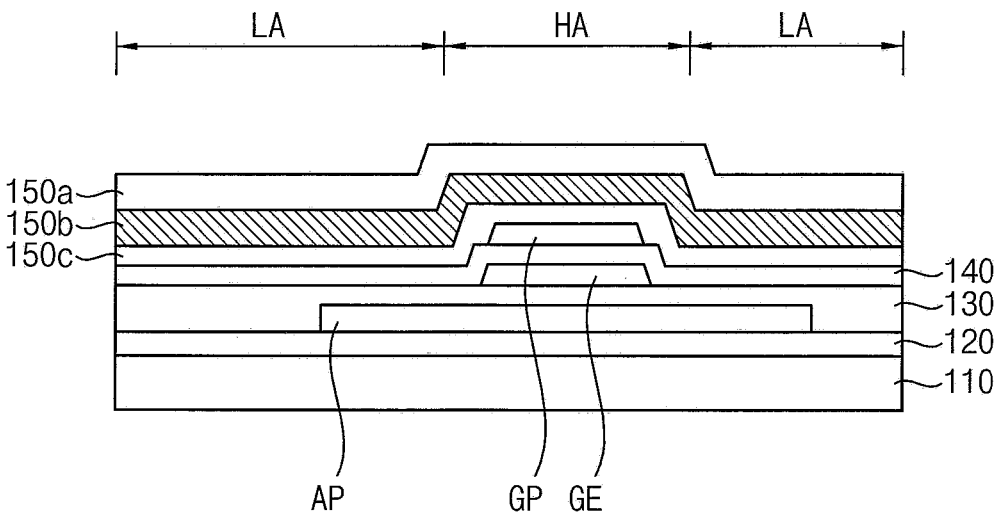
FIGS. 1 to 6 are schematic cross-sectional views illustrating methods for manufacturing a display device according to an embodiment.

Although the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Although terms such as first and second are used to describe various elements, the elements are not limited by such terms. Such terms are merely used to differentiate one element from another element. Therefore, a first element mentioned below may also be a second element within the spirit and scope of the disclosure.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Like reference numerals refer to like elements throughout this specification. In the figures, the thicknesses, ratios and dimensions of elements are exaggerated for effective description of the technical contents.

A polishing slurry, a method for manufacturing a display device using the polishing slurry and a display device according to embodiments of the inventive concept will be described hereinafter with reference to the accompanying drawings, in which some embodiments are shown.

Polishing Slurry

A polishing slurry according to an embodiment includes polishing particles, a dispersing agent, an oxide-polishing promoter and a nitride-polishing inhibitor.

For example, the polishing particles may include ceria, silica, alumina, zirconia, titania, or a combination thereof. In an embodiment, the polishing particles may include ceria, preferably wet ceria.

For example, an average diameter of the polishing particles may be about 6 nm to about 350 nm, preferably, about 20 nm to about 100 nm. When the diameter of the polishing particles is excessively small, a polishing rate of the polishing slurry may be reduced. When the diameter of the polishing particles is excessively large, a micro-scratch may be formed at a polished object.

For example, the polishing particles may be in an amount of about 0.01 wt % to about 10 wt %, preferably about 0.1 wt % to about 3 wt %/ When the polishing particles are in an amount of less than about 0.01 wt %, a polishing rate of the polishing slurry may be reduced. When the polishing particles are in an amount greater than about 10 wt %, dispersion stability may be reduced, and a micro-scratch may be formed at a polished object.

The dispersing agent may disperse the polishing particles in the polishing slurry to prevent aggregation of the polishing particles. For example, the dispersing agent may include an anionic dispersing agent, a cationic dispersing agent, a non-ionic dispersing agent, a hydroxyl acid compound, or a combination thereof.

For example, the anionic dispersing agent may include oxalic acid, citric acid, polysulfonic acid, polyacrylic acid, polymethacrylic acid, a copolymer thereof, a salt thereof, or a combination thereof.

For example, the cationic dispersing agent may include polylysine, polyethylene imine, benzetonium chloride, bronidox, certrimonium bromide, cetriummonium chloride, dimethyl dioctadecyl ammonium chloride, tetramethylammonium hydroxide, distearyl dimethylammonium chloride, dimethylamine-epichlorohydrin polymer, 1,2-dioleoyl-3-trimethylammonium propane, polyarylamine. or a combination thereof.

For example, the non-ionic dispersing agent may include polyoxyethylene oxide, polyethylene oxide, polypropylene oxide, a copolymer thereof, or a combination thereof.

For example, the hydroxyl acid compound may include hydroxyl benzoic acid, ascorbic acid, a salt thereof, or a combination thereof.

For example, the dispersing agent may be included in an amount of about 0.005 wt % to about 0.1 wt %, preferably about 0.01 wt % to about 0.06 wt %. When the content of the dispersing agent is less than about 0.005 wt %, dispersion of the polishing particles may be deteriorated. When the content of the dispersing agent is larger than about 0.1 wt %, cohesion of polymeric materials may be increased, and dispersion stability may be reduced by increased ionization concentration.

The oxide-polishing promoter may include a zwitterionic monomolecular compound containing a carboxyl group and an amine group. In an embodiment, the oxide-polishing promoter may include a pyridine compound. For example, the pyridine compound may include pyridine carboxylic acid. For example, the pyridine carboxylic acid may include picolinic acid, nicotinic acid, isonicotinic acid, or a combination thereof.

The oxide-polishing promoter may promote polishing of an oxide layer including $SiO_2$ or the like. For example, the oxide-polishing promoter may promote a chemical bonding between the polishing particles and the oxide layer thereby promoting polishing of the oxide layer. Furthermore, the oxide-polishing promoter may inhibit hydration reaction on a surface of a nitride layer thereby reducing a polishing rate for the nitride layer.

For example, the oxide-polishing promoter may be included in an amount of about 0.001 wt % to about 1 wt %, preferably about 0.01 wt % to about 0.1 wt %, more preferably, about 0.04 wt % to about 0.07 wt %. When the content of the oxide-polishing promoter is less than about 0.001 wt %, a polishing rate for silicon oxide may be reduced thereby reducing the selectivity of the polishing slurry. When the content of the oxide-polishing promoter is larger than about 1 wt %, dispersion stability of the polishing slurry may be reduced.

The nitride-polishing inhibitor may include a monomolecular compound containing a carboxyl group. For example, the nitride-polishing inhibitor may include an amino acid or an anionic organic acid. For example, the nitride-polishing inhibitor may include glycine, alanine, proline, valine, leucine, isoleucine, methionine, phenylalanine, tyrosine, tryptophan, serine, threonine, cysteine, asparagine, glutamine, lysine, arginine, histidine, aspartic acid, glutamic acid, acetic acid, gluconic acid, succinic acid, oxalic acid, malic acid, maleic acid, or a combination thereof.

The nitride-polishing inhibitor may include an anionic amino acid. For example, the nitride-polishing inhibitor may include aspartic acid, glutamic acid, or a combination thereof.

The nitride-polishing inhibitor may adhere to a surface of a nitride layer including $Si_3N_4$ or the like, which has a positive zeta potential, thereby inhibiting polishing of the nitride layer.

For example, a content of the nitride-polishing inhibitor may be about 0.001 wt % to about 1 wt %, preferably about 0.01 wt % to about 0.1 wt %. When the content of the nitride-polishing inhibitor is less than about 0.001 wt %, polishing of the nitride layer may not be inhibited. Thus, the selectivity of the polishing slurry may be reduced. More preferably, the content of the nitride-polishing inhibitor may be at least 0.05 wt % and less than 0.1 wt %. When the content of the nitride-polishing inhibitor is at least about 0.1 wt %, the selectivity of the polishing slurry may be reduced.

The polishing slurry may further include a pH-adjusting agent. For example, a pH of the polishing slurry may be about 2 to about 10, preferably about 3 to about 8. For example, the pH-adjusting agent may include $HNO_3$, $NH_4OH$, NaOH, KOH, trimethyl ammonium hydroxide (TMAH), or a combination thereof.

The polishing slurry may further include a remainder of water. The water may be deionized water. A content of the water may be changed depending on the contents of the other components. For example, the content of the water may be about 90 wt % to about 99.5 wt %.

The polishing slurry may increase a selectivity between silicon oxide and silicon nitride. For example, the selectivity of the polishing slurry for silicon oxide to silicon nitride may be at least about 70:1, preferably at least about 80:1. The polishing slurry having the large selectivity may be used in a process planarizing a silicon oxide layer using a silicon nitride layer as an etch-stop layer to achieve a small height difference and a small residual distribution ratio.

Method for Manufacturing a Display Device

A method for manufacturing a display device and a display device according to embodiments of the inventive concept will be described hereinafter with reference to the accompanying drawings, in which some embodiments are shown. The method may use previously explained polishing slurries.

FIGS. 1 to 10 are schematic cross-sectional views illustrating methods for manufacturing a display device according to embodiments. In an embodiment, the display device may be an organic light-emitting display device.

Referring to FIG. 1, a buffer layer 120 is formed on a base substrate 110.

For example, the base substrate 110 may include glass, quartz, silicon, a polymeric material or the like. In an embodiment, the base substrate 110 may be a flexible substrate that may include a polymeric material. For example, the polymeric material may include polyethylene terephthalate, polyethylene naphthalate, polyether ketone, polycarbonate, polyarylate, polyether sulfone, polyimide, or a combination thereof.

The buffer layer 120 may prevent or reduce penetration of impurities, humidity or external gas from underneath of the base substrate 110, and may planarize an upper surface of the base substrate 110. For example, the buffer layer 120 may include an inorganic material such as silicon oxide, silicon nitride or the like, or a combination thereof.

An active pattern AP is formed on the buffer layer 120.

For example, the active pattern AP may include a semiconductive material such as amorphous silicon, polycrystalline silicon (polysilicon), a metal oxide, or the like. When the active pattern AP may include polysilicon, at least a portion of the active pattern AP may be doped with impurities such as n-type impurities or p-type impurities.

In another embodiment, an active pattern may include a metal oxide semiconductor. For example, the active pattern may include two-component compound (ABx), ternary compound (ABxCy) or four-component compound (ABxCyDz), which contains indium (In), zinc (Zn), gallium (Ga), tin (Sn), titanium (Ti), aluminum (Al), hafnium (Hf), zirconium (Zr), magnesium (Mg). For example, the active pattern may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), or the like.

A first insulation layer 130 is formed on the active pattern AP. A first gate metal pattern including a gate electrode GE may be formed on the first insulation layer 130. The gate electrode may overlap the active pattern AP. A second insulation layer 140 may be formed to cover the first gate metal pattern. A second gate metal pattern including a gate wiring pattern GP may be formed on the second insulation layer 140. The gate wiring pattern GP may include a capacitor electrode, a signal wiring for transferring a driving signal, or the like.

For example, the first insulation layer 130 and the second insulation layer 140 may respectively include silicon oxide, silicon nitride, silicon carbide, or a combination thereof. Furthermore, the first insulation layer 130 and the second insulation layer 140 may include an insulating metal oxide such as aluminum oxide, tantalum oxide, hafnium oxide, zirconium oxide, titanium oxide or the like. For example, the first insulation layer 130 and the second insulation layer 140 may respectively have a single-layered structure or a multi-layered structure, which may include silicon nitride and/or silicon oxide. The first insulation layer 130 may be referred to as a first gate insulation layer, and the second insulation layer 140 may be referred to as a second gate insulation layer.

For example, the first gate metal pattern and the second gate metal pattern may respectively include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layered structure or a multi-layered structure including different metal layers.

A preliminary insulation layer may be formed on the second gate metal pattern. The preliminary insulation layer may include a lower silicon oxide layer 150c, a silicon nitride layer 150b and an upper silicon oxide layer 150a, which are stacked. In an embodiment, the lower silicon oxide layer 150c, the silicon nitride layer 150b and the upper silicon oxide layer 150a may be sequentially stacked.

The preliminary insulation layer may be formed by a chemical vaporization deposition (CVD) or the like, and may be formed to be conformal on a layer or a pattern disposed thereunder. Thus, the preliminary insulation layer may have a step depending on a profile of a lower structure. For example, heights of upper surfaces of the lower silicon oxide layer 150c, the silicon nitride layer 150b and the upper silicon oxide layer 150a may be greater in a first area HA overlapping the first gate metal pattern or the second gate metal pattern than in a second area LA not overlapping the either the first gate metal pattern or the second gate metal pattern.

When the preliminary insulation layer is polished in the following processes, the silicon nitride layer 150b may function as an etch-stop layer. In an embodiment, the upper surface of the silicon nitride layer 150b may be lower in the second area LA than in the first area HA.

Figure 2:
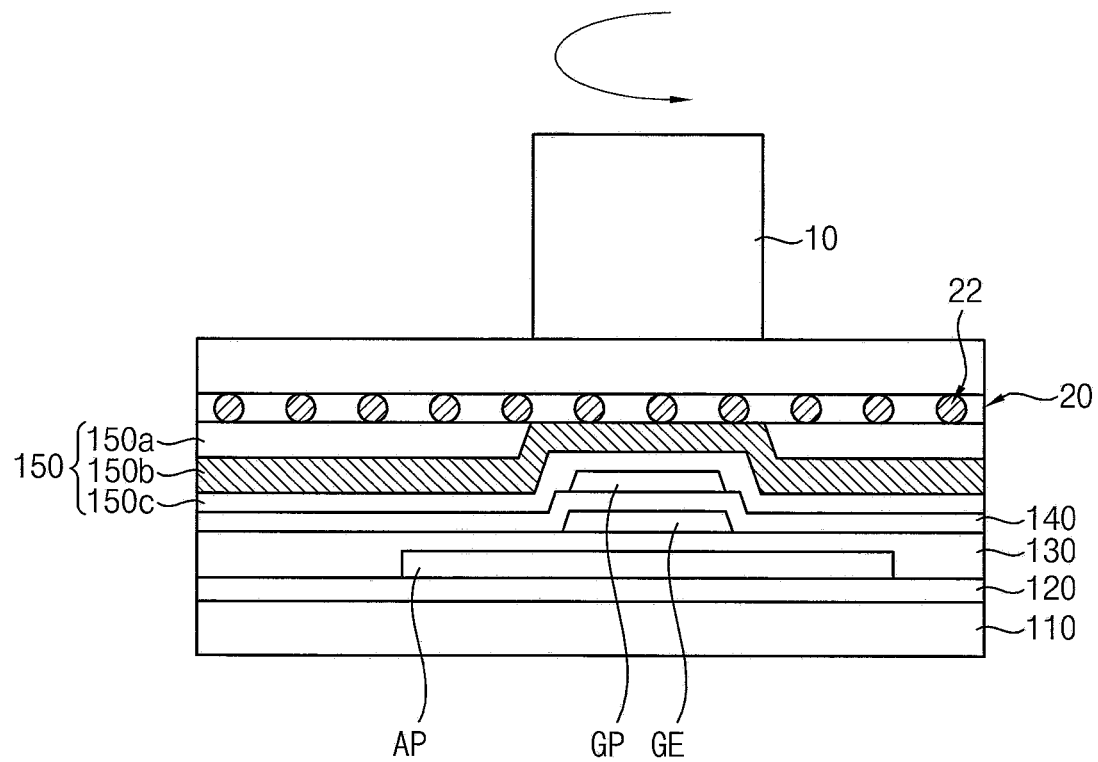
Figure 3:
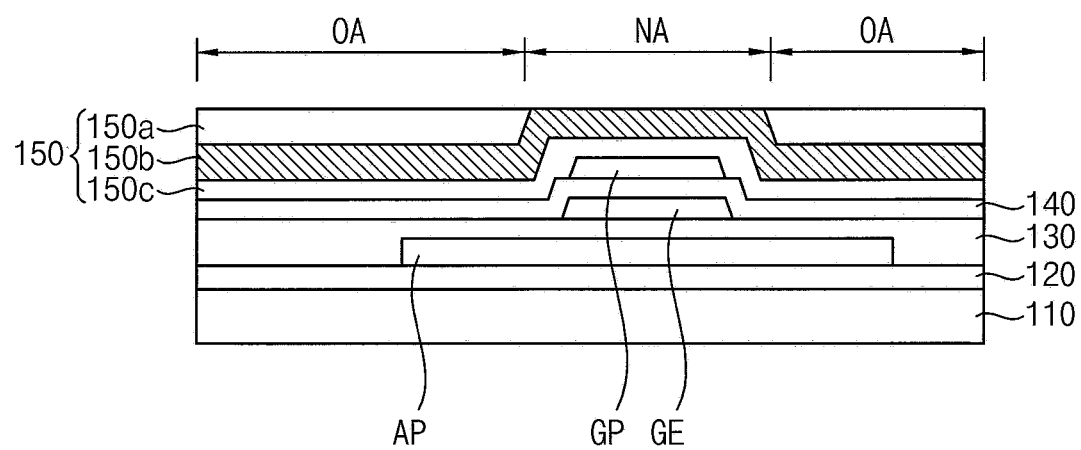

Referring to FIGS. 2 and 3, the preliminary insulation layer is polished to form a third insulation layer 150 having a multi-layered structure including silicon oxide and silicon nitride. The third insulation layer 150 may have a flat upper surface.

A polishing slurry 20 including polishing particles 22, which is previously explained, may be used for polishing the preliminary insulation layer. In an embodiment, the polishing slurry may include polishing particles, a dispersing agent, an oxide-polishing promoter and a nitride-polishing inhibitor. For example, the polishing slurry may include about 0.01 wt % to about 10 wt % of ceria particles, about 0.005 wt % to about 0.1 wt % of a non-ionic dispersing agent, about 0.001 wt % to about 1 wt % of a pyridine carboxylic acid, about 0.05 wt % to about 0.1 wt % of an anionic amino acid, and water.

For example, the polishing slurry may be provided on the upper silicon oxide layer 150a, and a polishing member 10 operates on the upper silicon oxide layer 150a to chemically and mechanically polish the upper silicon oxide layer 150a. In an embodiment, the polishing member 10 is rotated on the upper silicon oxide layer 150a to chemically and mechanically polish the upper silicon oxide layer 150a.

The polishing slurry has a relatively large polishing rate for silicon oxide, and a relatively small polishing rate for silicon nitride. Thus, the silicon nitride layer 150b may function as an etch-stop layer.

For example, when the upper silicon oxide layer 150a is polished to expose the upper surface of the silicon nitride layer 150b, polishing is not substantially further progressed, or a polishing rate is rapidly reduced. Thus, the third insulation layer 150 having a desired thickness and a flat upper surface may be obtained.

The third insulation layer 150 may include the lower silicon oxide layer 150c, the silicon nitride layer 150b and the upper silicon oxide layer 150a. The upper silicon oxide layer 150a may be disposed partially on the silicon nitride layer 150b. Thus, the upper surface of the third insulation layer 150 may include a nitride-exposed area NA and an oxide-exposed area OA. For example, the nitride-exposed area NA may overlap at least a portion of the first gate metal pattern or the second gate metal pattern. The third insulation layer 150 may be referred to as an interlayer insulation layer, or a planarized insulation layer.

Figure 4:
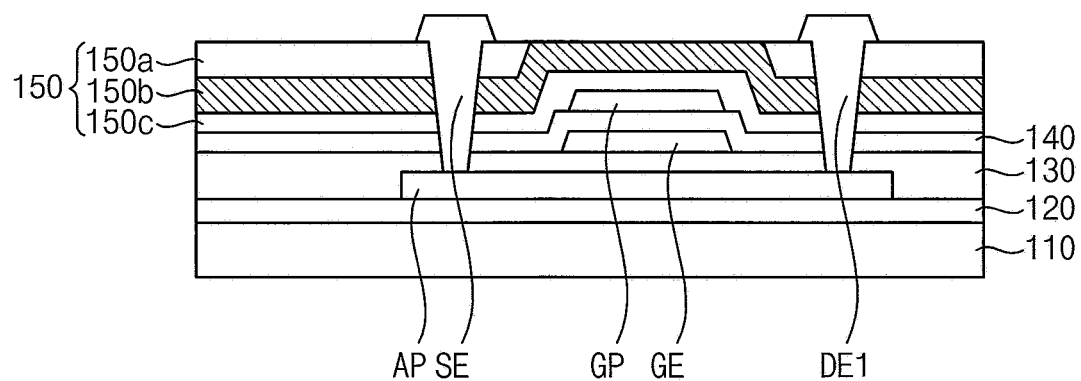

Referring to FIG. 4, a first source metal pattern is formed on the third insulation layer 150. The first source metal pattern may include a source electrode SE and a drain electrode DE, which respectively electrically contact the active pattern AP. In this disclosure, "electric contact" or "electrically contacting" may include "electric connection" or "being electrically connected". For example, the source electrode SE and the drain electrode DE may pass through the third insulation layer 150, the second insulation layer 140 and the first insulation layer 130 to electrically contact the active pattern AP.

For example, the first source metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layered structure or a multi-layered structure including different metal layers.

Referring to FIG. 4, the first source metal pattern may be disposed on the oxide-exposed area OA. However, embodiments are not limited thereto. For example, the first source metal pattern may overlap the nitride-exposed area NA or both the oxide-exposed area OA and the nitride-exposed area NA.

Figure 5:
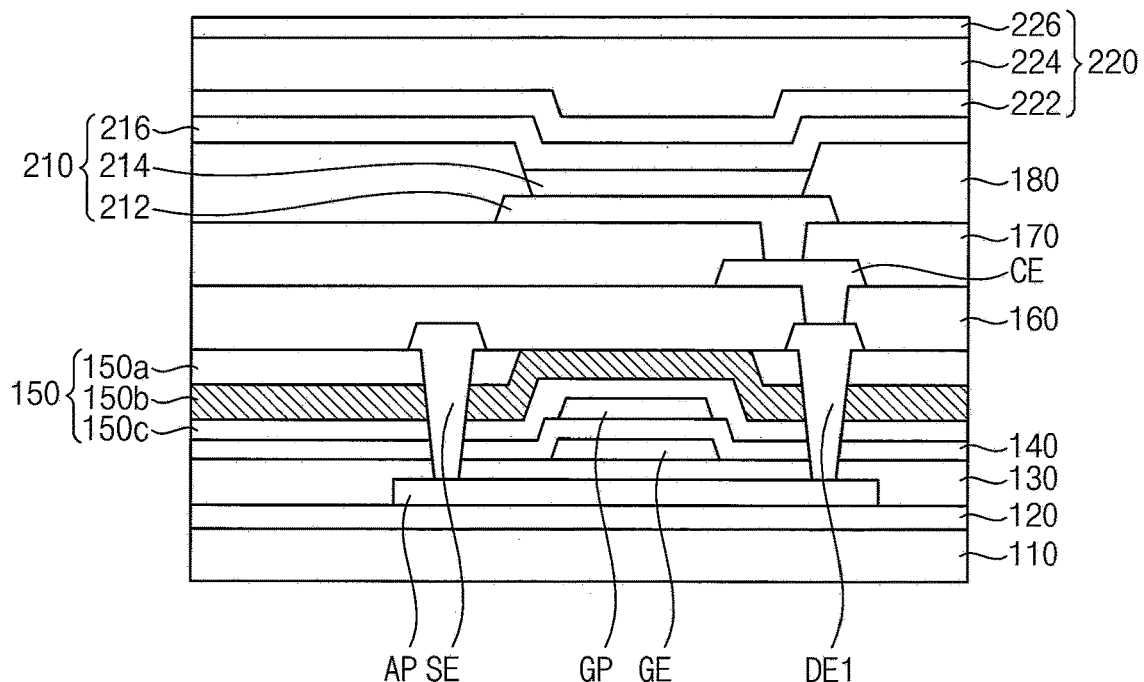

Referring to FIG. 5, a fourth insulation layer 160 is formed to cover the first source metal pattern. The fourth insulation layer 160 may include an inorganic insulation material, an organic insulation material or a combination thereof. For example, the organic insulation material may include a phenol resin, an acryl resin, a polyimide resin, a polyamide resin, an epoxy resin, benzocyclobutene, or the like.

Thereafter, a second source metal pattern is formed on the fourth insulation layer 160. The second source metal pattern may include a connection electrode CE electrically connected to the drain electrode DE. For example, the connection electrode CE may pass through the fourth insulation layer 160 to electrically contact the drain electrode DE. The second source metal pattern may further include a mesh power line to compensate for a voltage drop of a current applied to an organic light-emitting diode.

Thereafter, a fifth insulation layer 170 is formed to cover the second source metal pattern. The fifth insulation layer 170 may include an opening exposing at least a portion of the connection electrode CE. For example, the fifth insulation layer 170 may include an organic insulation material.

The fourth insulation layer 160 may be referred to as a first via insulation layer, and the fifth insulation layer 170 may be referred to as a second via insulation layer.

A first diode electrode 212 of an organic light-emitting diode 210 may be formed on the fifth insulation layer 170.

The first diode electrode 212 may include a metal, a metal alloy, a metal oxide, a metal fluoride or a combination thereof. In an embodiment, the first diode electrode 212 may function as an anode. For example, the first diode electrode 212 may be formed as a transmitting electrode or a reflecting electrode according to an emission type of the display device. For example, when the first diode electrode 212 is a reflecting electrode, the first diode electrode 212 may have a multi-layered structure including a metal oxide layer and a metal layer. The metal oxide layer may include indium tin oxide, indium zinc oxide, zinc tin oxide, indium oxide, zinc oxide, tin oxide, or a combination thereof. The metal layer may include gold (Au), silver (Ag), aluminum (Al), copper (Cu), nickel (Ni), platinum (Pt), magnesium (Mg), chromium (Cr), tungsten (W), molybdenum (Mo), titanium (Ti), or a combination thereof.

The pixel-defining layer 180 may be formed on the fifth insulation layer 170. The pixel-defining layer 180 may have an opening exposing at least a portion of the first diode electrode 212. For example, the pixel-defining layer 180 may include an organic insulating material.

An organic light-emitting layer 214 is formed on the first diode electrode 212. For example, the organic light-emitting layer 214 may be formed in the opening of the pixel-defining layer 180. However, embodiments are not limited thereto. For example, the organic light-emitting layer 214 may extend over an upper surface of the pixel-defining layer or may be formed as a common layer extending over pixels in a display area.

The organic light-emitting layer 214 may include at least a light-emitting layer, and may further include at least one selected among a hole injection layer (HIL), a hole transporting layer (HTL), an electron transporting layer (ETL), and an electron injection layer (EIL). For example, the organic light-emitting layer 214 may include a low molecular weight organic compound or a high molecular weight organic compound.

In an embodiment, the organic light-emitting layer 214 may emit a red light, a green light or a blue light. In another embodiment, the organic light-emitting layer 214 may emit a white light. The organic light-emitting layer 214 emitting a white light may have a multi-layered structure including a red-emitting layer, a green-emitting layer and a blue-emitting layer, or a single-layer structure including a mixture of a red-emitting material, a green-emitting material and a blue-emitting material.

A second diode electrode 216 may be formed on the organic light-emitting layer 214. The second diode electrode 216 may be formed as a common layer extending over pixels in the display area.

For example, the second diode electrode 216 may include a metal, a metal alloy, a metal nitride, a metal fluoride, a metal oxide, or a combination thereof. In an embodiment, the second diode electrode 216 may function as an cathode. For example, the second diode electrode 216 may be formed as a transmitting electrode or a reflecting electrode according to an emission type of the display device. For example, when the second diode electrode 216 is a transmitting electrode, the second diode electrode 216 may include lithium (Li), calcium (Ca), lithium fluoride, aluminum (Al), magnesium (Mg), indium tin oxide, indium zinc oxide, zinc tin oxide, indium oxide, zinc oxide, tin oxide, or a combination thereof.

An encapsulation layer 220 may be disposed on the second diode electrode 216. For example, the encapsulation layer 220 may have a stacked structure that may include an organic thin film and/or an inorganic thin film. For example, as illustrated in FIG. 5, the encapsulation layer 220 may include a first inorganic thin film 222, an organic thin film 224 disposed on the first inorganic thin film 222 and a second inorganic thin film 226 disposed on the organic thin film 224. However, embodiments are not limited thereto. For example, the encapsulation layer 220 may include at least two organic thin films and at least three inorganic thin films.

For example, the organic thin film 224 may include a cured resin such as polyacrylate or the like. For example, the cured resin may be formed from cross-linking reaction of monomers. For example, the inorganic thin films 222 and 226 may include an inorganic material such as silicon oxide, silicon nitride, silicon carbide, aluminum oxide, tantalum oxide, hafnium oxide, zirconium oxide, titanium oxide, or the like.

According to an embodiment, the upper surface of the interlayer insulation layer may be planarized. Thus, profile uniformity of the first source metal pattern formed on the interlayer insulation layer may be increased, and defects such as disconnection may be reduced. Furthermore, an efficient design for reducing a line width or the like may be achieved.

Embodiments are not limited to planarizing the interlayer insulation layer and may be applied for planarizing various inorganic layers to manufacture a display device having various configurations. Furthermore, the inorganic layer to be planarized may have various combinations depending on a desired thickness and a desired property.

Figure 6:
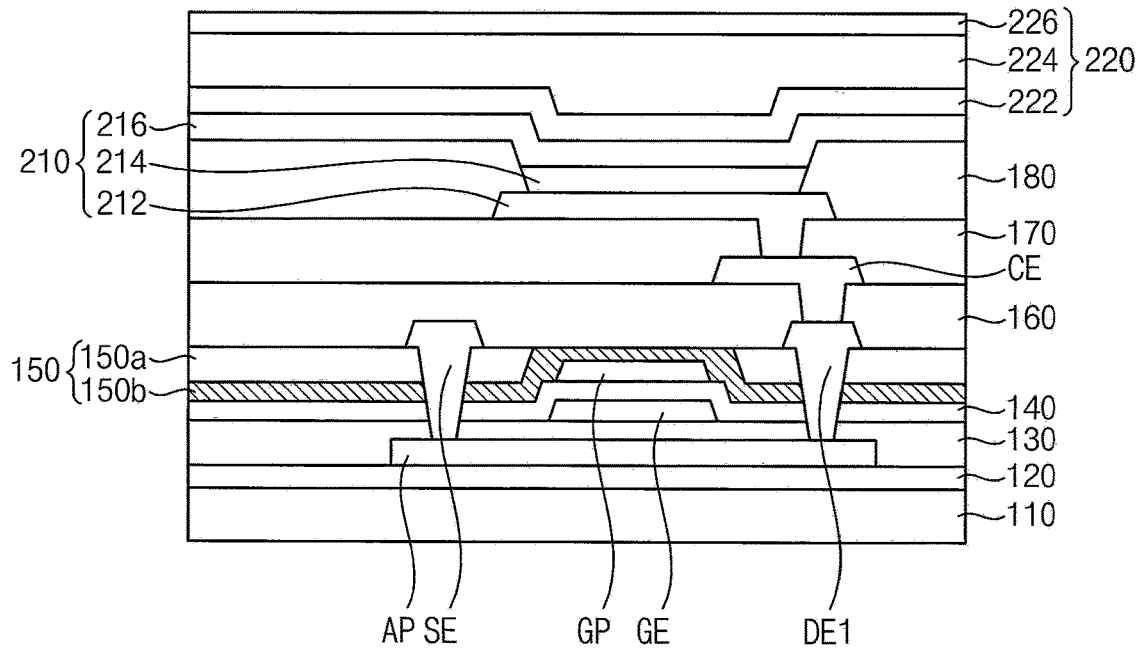

Referring to FIG. 6, a third insulation layer 150 covers a first gate metal pattern including a gate electrode GE or a second gate metal pattern including a gate wiring pattern GP. The third insulation layer 150 may have a flat upper surface.

The third insulation layer 150 includes a silicon nitride layer 150*b* and a silicon oxide layer 150*a* disposed on the silicon nitride layer 150*b*. The silicon oxide layer 150*a* is disposed partially on the silicon nitride layer 150*b*. Thus, the upper surface of the third insulation layer 150 may include a nitride-exposed area and an oxide-exposed area. For example, the nitride exposed area may overlap at least one of the first gate metal pattern and the second gate metal pattern.

Figure 7:
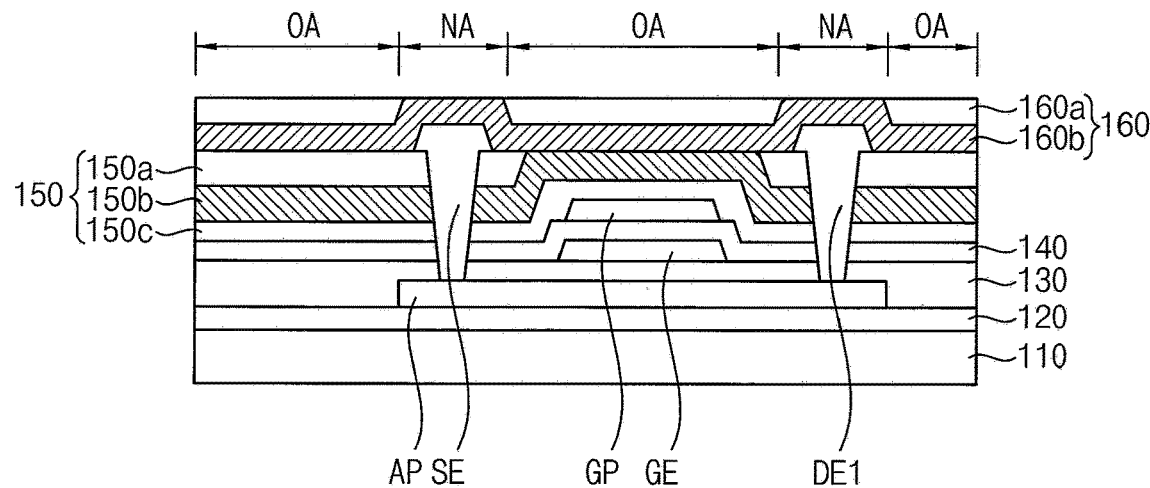
FIGS. 7 and 8 are schematic cross-sectional views illustrating methods for manufacturing a display device according to an embodiment where a fourth insulation layer is formed to include a silicon oxide layer and a silicon nitride layer.

Referring to FIG. 7, a fourth insulation layer 160 covers a first source metal pattern including a source electrode SE and a drain electrode DE. The fourth insulation layer 160 may be planarized by using a polishing slurry to have a flat upper surface.

The fourth insulation layer 160 includes a silicon nitride layer 160*b* and a silicon oxide layer 160*a* disposed on the silicon nitride layer 160*b*. The silicon oxide layer 160*a* may be disposed partially on the silicon nitride layer 160*b*. Thus, the upper surface of the fourth insulation layer 160 may include a nitride-exposed area NA and an oxide-exposed area OA. For example, the nitride exposed area NA may overlap the first source metal pattern.

Figure 8:
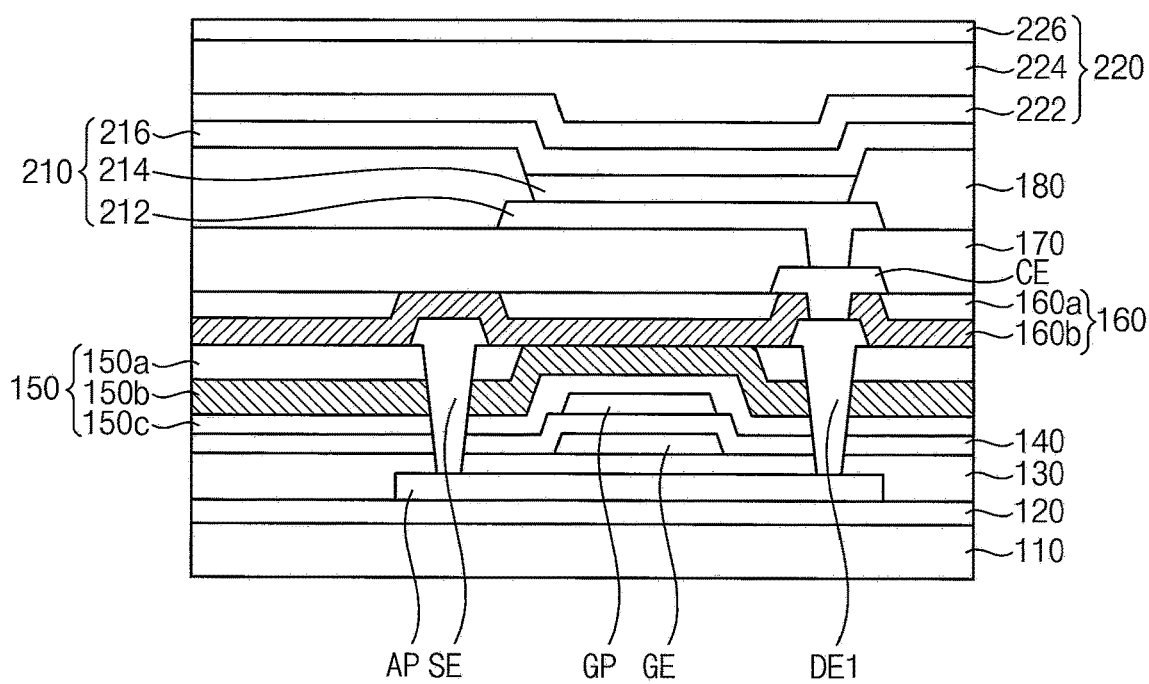

Referring to FIG. 8, a second source metal pattern that may include a connection electrode CE may be formed on the flat upper surface of the source insulation layer 160. Thus, an organic insulation layer for planarization may be omitted.

A display device according to an embodiment may have a hybrid configuration including a silicon semiconductor and an oxide semiconductor.

Figure 9:
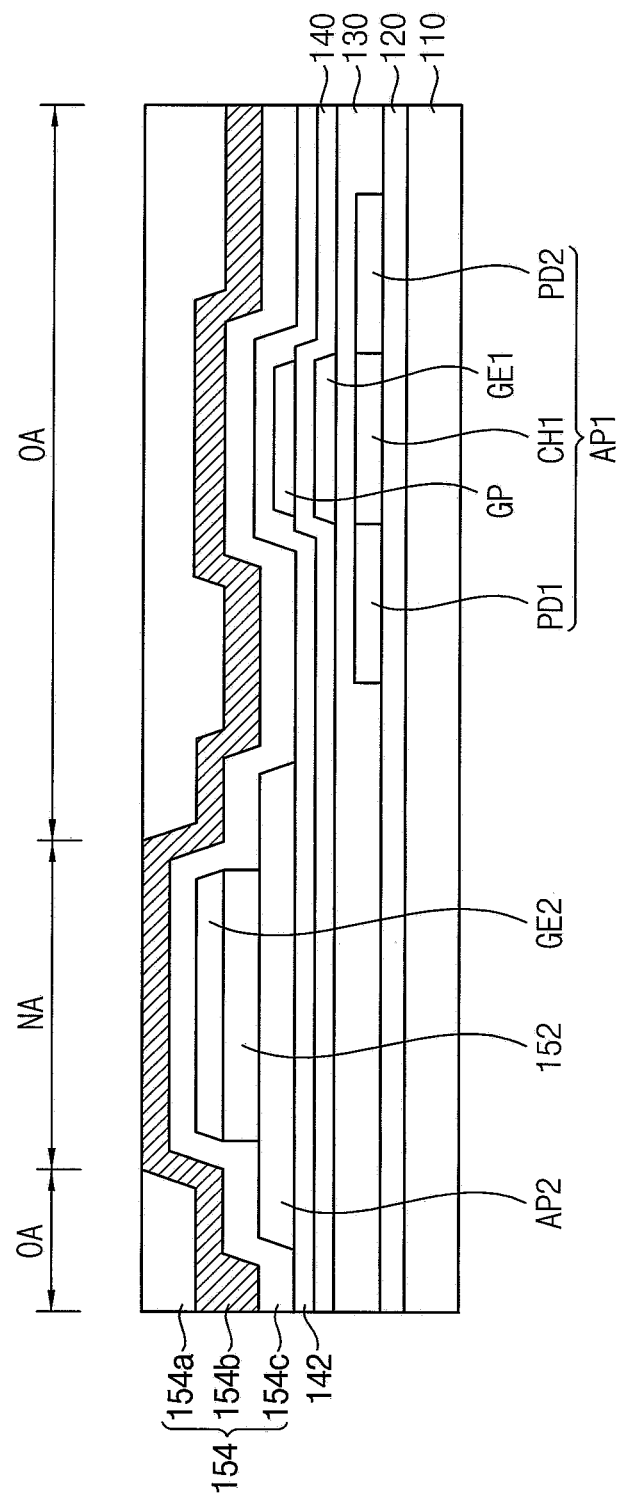
FIGS. 9 and 10 are schematic cross-sectional views illustrating methods for manufacturing a display device according to an embodiment where an upper interlayer insulation layer is formed.

Referring to FIG. 9, a first active pattern AP1 disposed on a base substrate 110 may include polysilicon. The first active pattern AP1 may include a first doped area PD1, a second doped area PD2 and a channel area CH1 disposed between the first doped area PD1 and the second doped area PD2.

The first doped area PD1 and the second doped area PD2 may be doped with n-type impurities or p-type impurities. The channel area CH1 may be doped with impurities of a different type from the doped areas.

A first gate metal pattern including a first gate electrode GE1 may be disposed on the first active pattern AP1. A second gate metal pattern including a gate wiring pattern GP may be disposed on the first gate metal pattern. A first gate insulation layer 130 may be disposed between the first active pattern AP1 and the first gate metal pattern. A second gate insulation layer 140 may be disposed between the first gate metal pattern and the second gate metal pattern.

A lower interlayer insulation layer 142 may be formed on the second gate metal pattern.

A second active pattern AP2 may be formed on the lower interlayer insulation layer 142. The second active pattern AP2 may include an oxide semiconductor. For example, the second active pattern AP2 may include a metal oxide.

A third gate metal pattern that may include a second gate electrode GE2 may be disposed on the second active pattern AP2. A gate insulation pattern 152 may be disposed between the second gate electrode GE2 and the second active pattern AP2.

An upper interlayer insulation layer 154 is formed on the second gate electrode GE2. The upper interlayer insulation layer 154 may have a flat upper surface.

In an embodiment, the upper interlayer insulation layer 154 may include an upper silicon oxide layer 154*c*, a silicon nitride layer 154*b*, and an upper silicon oxide layer 154*a*. The upper silicon oxide layer 154*a* may be disposed partially on the silicon nitride layer 154*b*. Thus, the upper surface of the upper interlayer insulation layer 154 may include a nitride-exposed area NA and an oxide-exposed area OA. For example, the nitride exposed area NA may overlap the third gate metal pattern.

Figure 10:
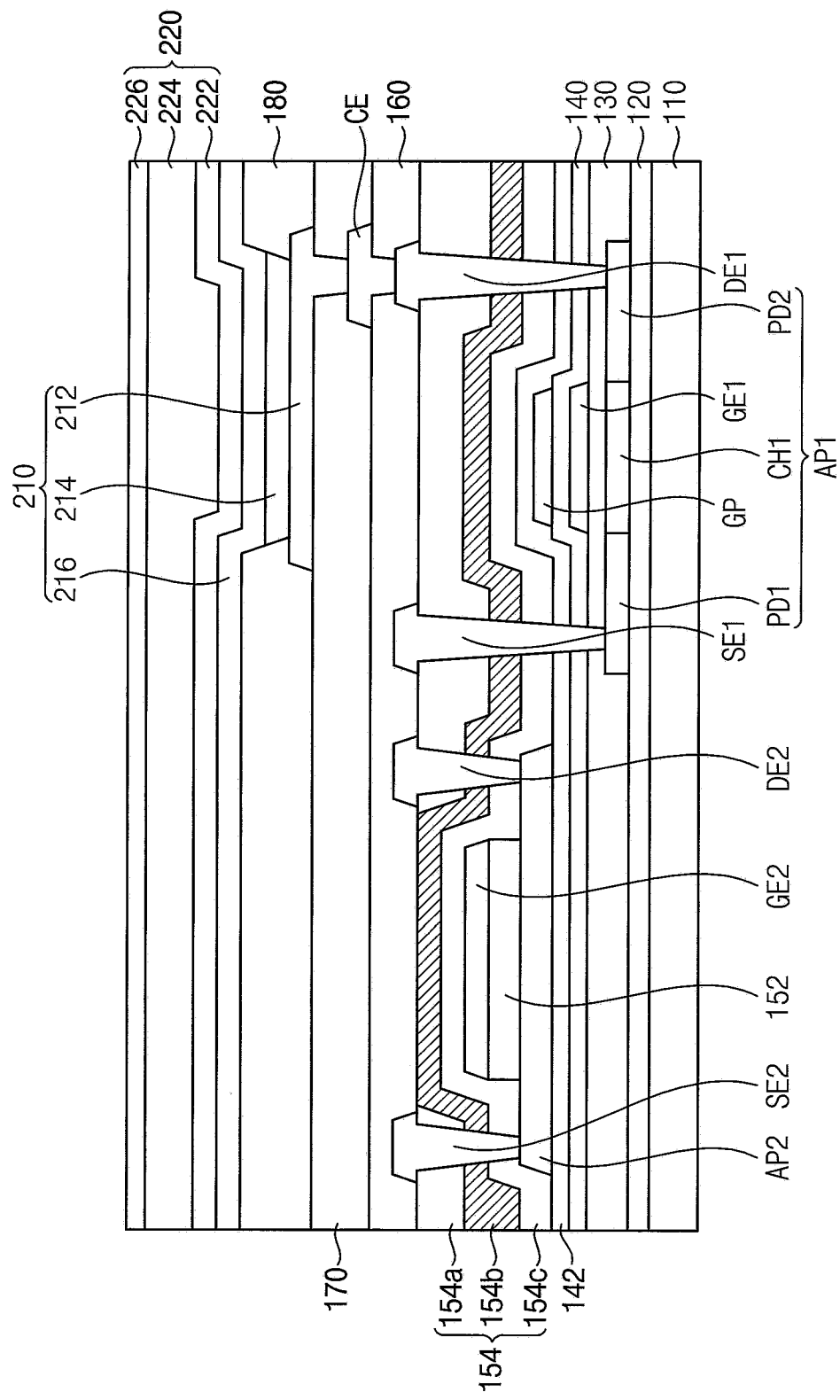

Referring to FIG. 10, a first source metal pattern is formed on the upper interlayer insulation layer 154.

The first source metal pattern may include a first source electrode SE1 electrically contacting the first doped area PD1 of the first active pattern AP1, a first drain electrode DE1 electrically contacting the second doped area PD2, a second source electrode SE2 electrically contacting the second active pattern AP2, and a second drain electrode DE2 electrically contacting the second active pattern AP2 and spaced apart from the second source electrode SE2. In an embodiment, a first transistor including the first active pattern AP1 may provide a driving current to an organic light-emitting diode 210. A second transistor including the second active pattern AP2 may operate the first transistor or another transistor that is not illustrated.

The first source metal pattern may be formed on the planarized upper interlayer insulation layer 154. Thus, the first source metal pattern may have an increased profile uniformity and reduced defects. Furthermore, an efficient design for reducing a line width or the like may be achieved.

In another embodiment, the lower interlayer insulation layer may be formed to have a flat upper surface and to have a multi-layered structure.

In an embodiment, an active pattern, a gate metal pattern, a source metal pattern, or the like, which causes an uneven upper surface of an insulation layer may be referred to as a lower structure.

Hereinafter, effects of polishing slurries according to embodiments will be explained with reference to specific examples and experimental results.

Experiment 1—Evaluation of an Effect Depending on a Content of an Oxide-Polishing Promoter Samples of polishing slurries including 1 wt % of wet ceria particles, 0.02 wt % of a polyethylene oxide/polypropylene oxide copolymer as a dispersing agent, 0 wt % to 0.1 wt % of picolinic acid as an oxide-polishing promoter and a remainder of deionized water were prepared, and sodium hydroxide was added thereto such that the pH was about 4. A polishing rate of each samples for an $SiO_2$ layer and $Si_3N_4$ layer was measured under the following conditions and represented by the following Table 1.

[Experimental Conditions 1]
  Polishing apparatus: G&P Poli-300
  Polishing pad: Suba-400
  Polishing speed (head/table): 80/80 rpm
  Wafer pressure: 4 psi
  Sample size: 4×4 $cm^2$
  Polishing time: 1 minute

TABLE 1

| Sample number | Picolinic acid | Polishing rate (Å/min) $SiO_2$ layer | Polishing rate (Å/min) $Si_3N_4$ layer | Polishing selectivity |
|---|---|---|---|---|
| 1 | 0 wt % | 114 | 128 | 1:1 |
| 2 | 0.01 wt % | 230 | 125 | 2:1 |
| 3 | 0.02 wt % | 668 | 99 | 7:1 |
| 4 | 0.03 wt % | 871 | 78 | 11:1 |
| 5 | 0.04 wt % | 912 | 71 | 13:1 |
| 6 | 0.05 wt % | 904 | 70 | 13:1 |
| 7 | 0.06 wt % | 754 | 69 | 11:1 |
| 8 | 0.07 wt % | 701 | 69 | 10:1 |
| 9 | 0.08 wt % | 680 | 65 | 10:1 |
| 10 | 0.09 wt % | 677 | 65 | 10:1 |
| 11 | 0.1 wt % | 605 | 60 | 10:1 |

Referring to Table 1, when the content of the oxide-polishing promoter was 0.03 wt % to 0.06 wt %, the polishing rates of the polishing slurries were relatively larger, and when the content of the oxide-polishing promoter was 0.04 wt % to 0.05 wt %, the polishing rates of the polishing slurries were largest.

Experiment 2—Evaluation of an Effect Depending on a Content of a Nitride-Polishing Inhibitor Samples of polishing slurries including 1 wt % of wet ceria particles, 0.02 wt % of a polyethylene oxide/polypropylene oxide copolymer as a dispersing agent, 0.04 wt % of picolinic acid as an oxide-polishing promoter, 0 wt % to 0.1 wt % of glutamic acid as a nitride-polishing inhibitor and a remainder of deionized water were prepared, and sodium hydroxide was added thereto such that the pH was about 4. A polishing rate of each samples for an $SiO_2$ layer an $Si_3N_4$ layer was measured under the same conditions as Experiment 1 and represented by the following Table 2.

TABLE 2

| Sample number | Glutamic acid | Polishing rate (Å/min) $SiO_2$ layer | Polishing rate (Å/min) $Si_3N_4$ layer | Polishing selectivity |
|---|---|---|---|---|
| 1 | 0 wt % | 912 | 71 | 13:1 |
| 2 | 0.01 wt % | 915 | 66 | 14:1 |
| 3 | 0.02 wt % | 924 | 61 | 15:1 |
| 4 | 0.03 wt % | 959 | 43 | 22:1 |
| 5 | 0.04 wt % | 971 | 20 | 49:1 |
| 6 | 0.05 wt % | 1004 | 11 | 91:1 |
| 7 | 0.06 wt % | 998 | 12 | 83:1 |
| 8 | 0.07 wt % | 940 | 12 | 78:1 |
| 9 | 0.08 wt % | 911 | 13 | 70:1 |
| 10 | 0.09 wt % | 814 | 11 | 74:1 |
| 11 | 0.1 wt % | 685 | 10 | 69:1 |

Referring to Table 2, when the content of the nitride-polishing inhibitor was 0.05 wt % to 0.1 wt %, the polishing rates of the polishing slurries were relatively larger.

Experiment 3—Evaluation of an Effect on a Large-Sized Substrate

Samples of polishing slurries including 1 wt % of wet ceria particles, 0.02 wt % of a polyethylene oxide/polypropylene oxide copolymer as a dispersing agent, 0.04 wt % of picolinic acid as an oxide-polishing promoter, 0.05 wt % of glutamic acid as a nitride-polishing inhibitor and a remainder of deionized water were prepared, and sodium hydroxide was added thereto such that the pH was about 4. A polishing rate of each samples for an $SiO_2$ layer an $Si_3N_4$ layer was measured under the following conditions and represented by the following Table 3.

[Experimental Conditions 2]
  Polishing apparatus: CMT CLCD-800
  Polishing pad: Suba-400
  Polishing speed (table): 1) 50 rpm 2) 70 rpm
  Wafer pressure: 1 psi
  Sample size: 2G glass (370×470 $mm^2$)
  Polishing time: 1 minute

TABLE 3

| Sample number | Polishing speed (table) | Polishing rate (Å/min) $SiO_2$ layer | Polishing rate (Å/min) $Si_3N_4$ layer | Polishing selectivity |
|---|---|---|---|---|
| 1 | 50 rpm | 970 | 7.5 | 129:1 |
| 2 | 70 rpm | 1348 | 8 | 169:1 |

Referring to Table 3, it can be noted that the polishing slurries may have large polishing selectivity even in the process of planarizing a large-sized substrate.

Embodiments may be used for manufacturing various electronic devices and electronic elements, which include an inorganic insulation layer, such as a display device, a sensor, a MEMS element, a thin film transistor, an integrated circuit, or the like.

The foregoing is illustrative of embodiments and is not to be construed as limiting thereof. Although embodiments have been described, those skilled in the art will readily appreciate that many modifications are possible in the embodiments without materially departing from the novel teachings and aspects of the inventive concept. Accordingly, all such modifications are intended to be included within the scope of the inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the inventive concept, as set forth in the claims and equivalents thereof.

What is claimed is:

1. A polishing slurry comprising:
  about 0.01 wt % to about 10 wt % of polishing particles;
  about 0.005 wt % to about 0.1 wt % of a dispersing agent including a polyethylene oxide/polypropylene oxide copolymer;
  about 0.001 wt % to about 1 wt % of an oxide-polishing promoter including picolinic acid;
  about 0.05 wt % to about 0.1 wt % of a nitride-polishing inhibitor; and
  water, wherein
  the nitride-polishing inhibitor includes glutamic acid, a pH of the polishing slurry is about 2 to about 4, and
a polishing selectivity of the polishing slurry for silicon oxide to silicon nitride is at least about 70:1.

2. The polishing slurry of claim 1, wherein the polishing particles include at least one selected from the group consisting of ceria, silica, alumina, zirconia, and titania particles.

3. The polishing slurry of claim 1, wherein the polishing particles have an average diameter of about 6 nm to about 350 nm.

4. The polishing slurry of claim 3, wherein the polishing particles have an average diameter of about 20 nm to about 100 nm.

5. The polishing slurry of claim 1, wherein the nitride-polishing inhibitor further includes at least one selected from the group consisting of glycine, alanine, proline, valine, leucine, isoleucine, methionine, phenylalanine, tyrosine, tryptophan, serine, threonine, cysteine, asparagine, glutamine, lysine, arginine, histidine, acetic acid, gluconic acid, succinic acid, oxalic acid, malic acid, and maleic acid.

6. The polishing slurry of claim 1, wherein a pH of the polishing slurry is about 3 to about 4.

7. The polishing slurry of claim 1, wherein
the polishing particles include ceria particles.

8. The polishing slurry of claim 1, wherein the polishing selectivity of the polishing slurry for silicon oxide to silicon nitride is 69:1 to 91:1.

\* \* \* \* \*